United States Patent
Athavale et al.

(10) Patent No.: US 6,559,001 B2
(45) Date of Patent: May 6, 2003

(54) METHODS OF PATTERNING A MULTI-LAYER FILM STACK AND FORMING A LOWER ELECTRODE OF A CAPACITOR

(75) Inventors: Satish D. Athavale, Fishkill, NY (US); Greg Costrini, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/867,929

(22) Filed: May 30, 2001

(65) Prior Publication Data

US 2002/0192900 A1 Dec. 19, 2002

(51) Int. Cl.$^7$ .......................................... H01L 21/8242
(52) U.S. Cl. ........................................ 438/243; 438/653
(58) Field of Search ................................ 438/210, 238, 438/243, 329, 377, 386, 653, 654

(56) References Cited

U.S. PATENT DOCUMENTS

| | | | |
|---|---|---|---|
| 5,204,210 A | * | 4/1993 | Jansen et al. |
| 5,300,460 A | * | 4/1994 | Collins et al. |
| 5,667,630 A | * | 9/1997 | Lo |
| 5,705,443 A | | 1/1998 | Stauf et al. .................. 438/722 |
| 5,825,609 A | | 10/1998 | Andricacos et al. ...... 361/321.4 |
| 6,037,264 A | | 3/2000 | Hwang .......................... 438/714 |
| 6,080,529 A | | 6/2000 | Ye et al. ....................... 430/318 |
| 6,086,777 A | * | 7/2000 | Cheng et al. |
| 6,087,265 A | | 7/2000 | Hwang .......................... 438/706 |
| 6,093,860 A | * | 7/2000 | Watanabe et al. |
| 6,169,009 B1 | | 1/2001 | Ju et al. ........................ 438/396 |
| 6,171,964 B1 | * | 1/2001 | Gonzalez et al. |
| 6,377,437 B1 | * | 4/2002 | Sexton et al. |

\* cited by examiner

*Primary Examiner*—David Nelms
*Assistant Examiner*—Phuc T. Dang
(74) *Attorney, Agent, or Firm*—Steven Capella; Cantor Colburn LLP

(57) ABSTRACT

A process for forming a multilayer film stack including a noble metal electrode and a multilayer barrier. The process includes exposing the film stack to a plasma formed of reactive species from an excitable gas mixture of argon, a chlorine bearing gas, a fluorine bearing gas and a carbon bearing gas. The method of forming the lower electrode of a capacitor includes simultaneously etching a multilayer barrier and an electrode layer.

23 Claims, 3 Drawing Sheets

METHODS OF PATTERNING A MULTI-LAYER FILM STACK AND FORMING A LOWER ELECTRODE OF A CAPACITOR

BACKGROUND OF THE INVENTION

The present invention relates to electrode and barrier materials for semiconductor memory devices or thin film capacitors containing ferroelectric or high-epsilon dielectric materials and in particular, to a method for patterning a lower electrode including a noble metal and multilayer barrier films.

The increasing density of integrated circuits (e.g. DRAMs) is increasing the need for materials with high dielectric constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use materials having a high dielectric constant. Many perovskite, ferroelectric, or high dielectric constant materials such as $(Ba,Sr)TiO_3$ (BST) usually have much larger capacitance densities than standard $SiO_2—Si_3 N_4—SiO_2$ capacitors. Various metals and metallic compounds, and typically noble metals such as Pt and conductive oxides such as $RuO_2$, have been proposed as the electrodes for these high dielectric constant materials. To be useful in electronic devices, however, reliable electrical connections should generally be constructed which do not diminish the beneficial properties of these high-dielectric-constant materials.

Multilayer barrier materials such as iridium oxide, iridium, tantalum silicon nitride, tantalum silicon and the like are being investigated for application in these high dielectric constant (BST) stacked capacitor memory cells. The multilayered barrier structures typically consist of two or more barrier materials. The barrier layer prevents inter-diffusion between underlying devices and a lower electrode material formed with the noble metal.

Noble metals are chosen for the electrode because these metals are generally resistant and/or inert to oxidation. Precious metals such as platinum, palladium, etc. are typically used as the electrode material. Of these, platinum appears to be most preferred since it is inert to oxidation, has a low leakage current ($<10^{-9}$ amps/cm$^2$) and exhibits high conductivity.

Etching multilayer film stacks including the barrier layers and electrode structures is difficult. Current processes are generally complex, and typically result in sloped sidewall profiles with significant amounts of etch residues remaining on the wafer. Moreover, current processes typically require multiple lithographic processing steps for patterning the barrier layer and then the electrode. For example, a prior art process may include the following steps: deposition of the barrier film stack onto a substrate, e.g., $IrO_2/Ir/TaSiN/TaSi$, followed by photolithographic patterning. The multilayer barrier is then etched such as for example by a chlorine ($Cl_2$) plasma. Since $IrCl_2$ is formed during the etching process, the wafer is then rinsed to removed the $IrCl_2$ residues. A dielectric interlayer is then deposited and further requires planarization to expose the $IrO_2$ surface of the multilayer barrier. The electrode, e.g., platinum, is then deposited which requires additional photolithographic processing. The electrode is etched and the mask is then removed to complete the multilayer film stack. The film stack after each patterning step are shown in the scanning electron microscopy photomicrographs of FIGS. 1 and 2. FIG. 1 is a cross section after the barrier layer stack is conventionally patterned and FIG. 2 shows the film stack after conventionally forming the electrode over the patterned barrier film stack. The process clearly results in poor profile angles, even after overetch conditions.

As described, the prior art typically requires numerous processing steps to first define the pattern in the multilayer barrier and then additional processing steps to define the pattern for the electrode. The numerous process steps to form the lower electrode of a capacitor significantly adds to the cost and complexity. The multiple process steps require rigid control of alignment and overlay. Moreover, cycle time is impacted as a result of the numerous process steps.

Accordingly there is a need for a simpler and more robust process for patterning multilayer film stacks containing a noble metal.

SUMMARY OF THE INVENTION

A method of forming a lower electrode of a capacitor. The method includes forming a barrier film on a semiconductor substrate. The barrier film includes one or more layers of a compound selected from the group consisting of titanium nitride, titanium silicate, titanium silicate nitride, titanium aluminum nitride, tantalum silicate and tantalum silicate nitride, iridium, iridium oxide and mixtures thereof. A conductive film containing a metal is formed on the barrier film. The conductive film includes one or more layers of a noble metal selected from the group consisting of platinum, palladium, gold, silver, ruthenium, osmium, rhenium, rhodium, iridium, oxides of these noble metals and alloys thereof. A patterned mask layer is formed on the conductive film, wherein the mask layer selectively exposes portions of the conducting film. A plasma etches the exposed portions of the conductive film to a surface of the semiconductor substrate, wherein the plasma removes the exposed portions of the conductive film and respective portions of the underlying barrier film. The plasma is formed from an excitable gas mixture essentially free from a hydrogen bearing gas. The hydrogen free excitable gas mixture includes argon gas, a chlorine bearing gas, a carbon bearing gas and a fluorine bearing gas.

A process for removing exposed portions of a multilayer film stack from a substrate wherein the multilayer film stack inlcudes a noble metal layer and one or more barrier layers. The process includes reacting the exposed portions of the multilayer film stack with reactive species for a period of time effective to substantially remove the film stack from the substrate. The reactive species are essentially free from hydrogen species and are generated by exposing an excitable gas mixture to an energy source sufficient to generate the reactive species. The gas mixture includes argon, a chlorine bearing compound, a carbon bearing compound and a fluorine bearing compound.

Other embodiments of the invention are contemplated to provide particular features and structural variants of the basic elements. The specific embodiments referred to as well as possible variations and the various features and advantages of the invention will become better understood when considered in connection with the detailed description and drawings that follow.

DETAILED DESCRIPTION OF PREFERRED EMBODIMENTS

Figure 1:
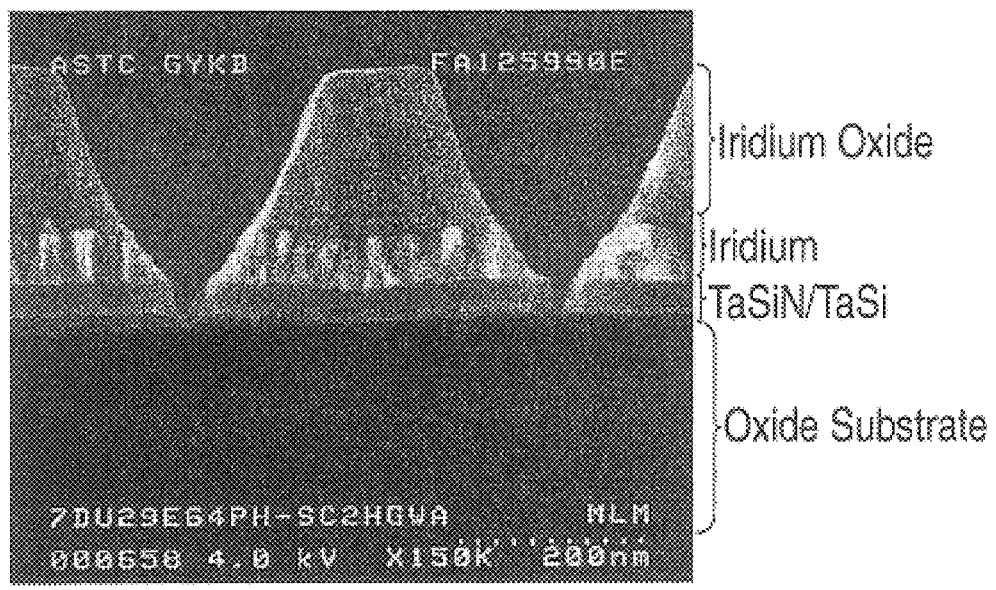
FIG. 1 is a scanning electron microscopy micrograph of a multilayer barrier film stack patterned bu a conventional plasma process.

A process for patterning multilayer film stacks containing noble metals. Preferably, the process is employed for patterning multilayer film stacks that integrate, into a single stack, different structural elements such as for example an electrode film and a barrier film. The electrode and barrier films comprising the film stack each may include one or more individual layers. The process is a single step process and advantageously, eliminates the need for multiple lithographic, alignments and overlay steps.

The process includes exciting a gas mixture to generate a plasma of reactive species and exposing the multilayer film stack to the reactive species for a period of time effective for removal. Preferably, the components of the plasma gas include argon, a chlorine bearing compound and a fluorine bearing compound. More preferably, the plasma gas includes argon, a chlorine bearing gas, a fluorine bearing gas and a carbon bearing compound. Optionally, the gas mixture may further include nitrogen gas. Nitrogen gas may be used to optimize the profiles of the film stack and may be used from about 0% to about 20% of the total volume of gases used in the plasma. Optimization of the profiles using small amounts of nitrogen gas added to the plasma is well within the skill of those in the art.

The particular components of the plasma gas are selected by their ability to form a gas and a plasma at plasma forming conditions. The components of the plasma gas are essentially free from hydrogen bearing compounds. Hydrogen bearing compounds have been found to vigorously react with the iridium oxide films in the film stack resulting in film peeling and particle generation. Either one of these conditions significantly impacts device yield and performance. Thus, the plasma process disclosed herein excludes the use of hydrogen bearing compounds in the reactor feed.

The chlorine bearing compounds generate reactive chlorine species under plasma forming conditions. Preferably, the chlorine bearing compounds include, but are not limited to, $Cl_2$, $BCl_3$, $CCl_4$, $SiCl_4$. Other chlorine bearing compounds suitable for use in the present invention will be apparent to those skilled in the art in view of this disclosure.

The fluorine bearing compounds generate reactive fluorine species under plasma forming conditions. Preferably, the fluorine bearing compounds include, but are not limited to, $F_2$, $CF_4$, $C_2F_6$, $C_4F_8$, $SF_6$ and mixtures thereof More preferably, the fluorine bearing compound is $CF_4$. Preferably, the fluorine bearing compound is added to the plasma gas mixture in an amount such that the concentration of reactive fluorine species is from about 1 percent to about 50 percent of the total reactive species in the plasma. More preferably, the reactive fluorine species range from about 7 percent to about 20 percent. The optimum percent value of fluorine in the gas mixture depends on the process conditions employed and the loading effect of the wafer. For example, it is believed that the elemental composition of the fluorine bearing compound affects the optimal ranges, e.g., $SF_6$ versus $CF_4$. Optimization of fluorine within the preferred ranges is well within the skill of those in the art in view of this disclosure.

The carbon bearing compounds generate reactive carbon species under plasma forming conditions. The carbon bearing compounds may be part of the fluorine bearing compound or the chlorine bearing compounds such as for example $CF_4$ and $CCl_4$. Care must be taken in selecting the source of carbon since, as previously noted, reactive hydrogen species causes highly destructive reduction of the $IrO_2$ film leading to peeling and particle generation. Preferably, the carbon bearing gas is part of the fluorine bearing compound. More preferably, the carbon bearing gas is $CF_4$. Preferably, the carbon bearing compound is added to the plasma gas mixture in an amount such that the concentration of reactive carbon species is from about 1 percent to about 20 percent. More preferably, the reactive carbon species range from about 2 percent to about 10 percent.

The parameters which influence the plasma include the particular reactive ion etching apparatus used, the power applied (both source power and bias power), the temperature of the apparatus, the pressure of the apparatus, the composition of the etchant gas, and the flow rate of the etchant gas mixture. One skilled in the art could easily select these parameters to excite the etchant gas mixture to achieve a high-density plasma, which is a plasma having a density of at least $10^{11}$ ions/cm$^3$. For example, a high-density plasma can be achieved by using an Applied Materials, Inc. Hot DPS reactive ion etching apparatus with a source power of 1200 watts and bias power from about 200 to about 450 watts, and utilizing various etchant gases at an effective pressure of about 5 to 40 millitorr.

Preferably, the wafer is heated during the etching process to a temperature greater than 200° C. More preferably, the wafer is heated to a temperature from about 300° C. to about 350° C. While not wanting to be bound by theory, it is believed that employing high temperatures during etching facilitates volatilization of the etching byproducts and reduces the sticking coefficient for redepositing species, i.e., the formation of veils and the like.

The etching process preferably uses a reactive ion etching process that combines plasma etching and ion beam etching principles. Accordingly, the plasma etch process occurs in two ways, either separately or in combination, depending on the material to be etched and the etch chemistry used: (1) chemically reactive ions and free radicals formed in the plasma strike the wafer surface, where they react with the surface material removing it from the surface and allowing it to be pumped away; (2) the ions may be accelerated to strike the wafer surface with sufficient impact energy to break the chemical bonds in the film, physically dislodging or "sputtering" material away, molecule by molecule. While not wanting to be bound by theory, it is believed that a combination of sputtering and chemical etching may occur during etching of noble metals, i.e., platinum.

Figure 2:
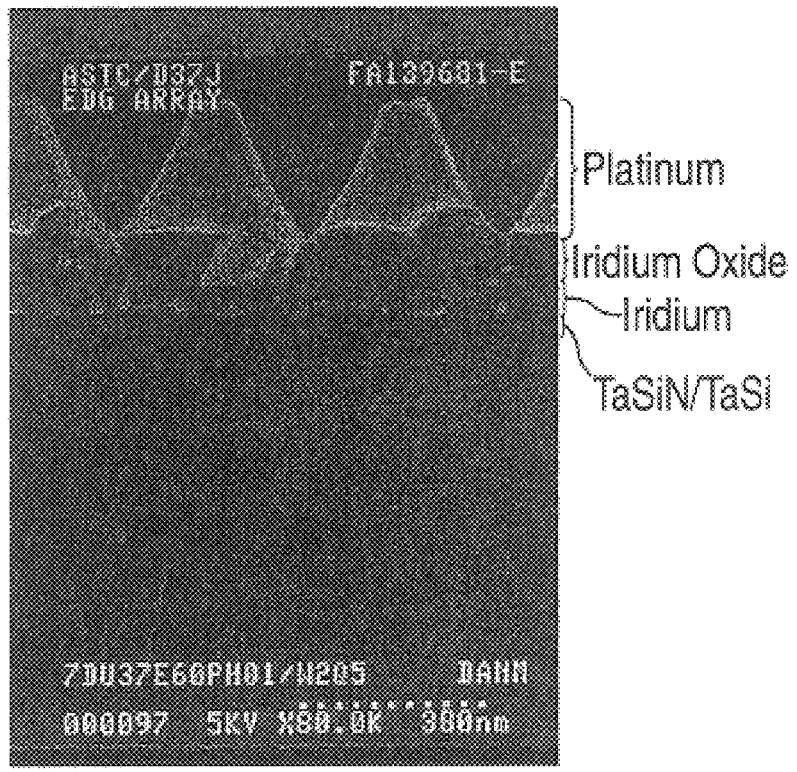
FIG. 2 is a scanning electron microscopy micrograph of a platinum electrode conventionally patterned over the multilayer barrier film stack of FIG. 1.
Figure 3:
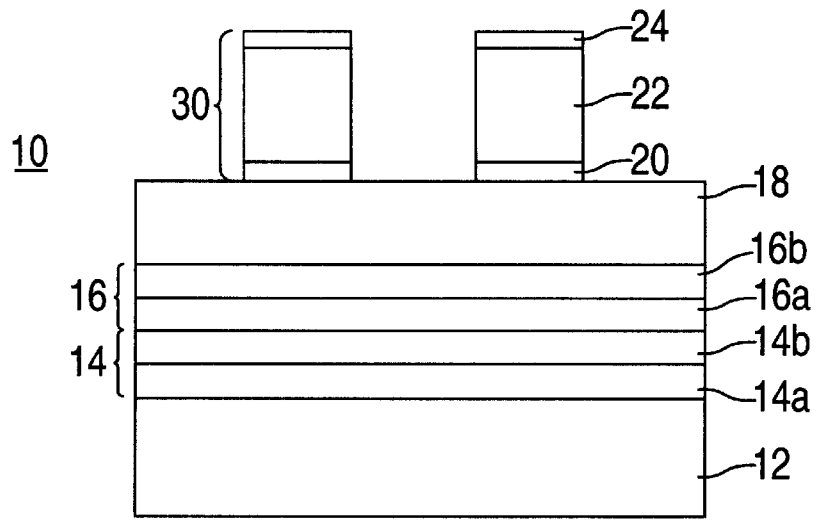
FIGS. 3–5 are section views of a semiconductor device constructed in accordance with an embodiment of the invention.

Referring now to the drawings wherein similar parts are identified by like reference numerals, there is shown in FIG. 3, a wafer generally designated as 10 having a semiconductor substrate 12. The substrate 12 includes regions of circuit elements which do not appear in the drawings, but are well known to those skilled in the art. For example, the substrate may include conductive plugs, interlevel dielectrics, transistors and the like. A multilayer barrier and electrode film stack is formed by first depositing a layer 14 onto the substrate. Layer 14 prevents diffusion between underlying conductive plugs/devices in substrate 12 and a lower electrode material to be later formed by subsequent process steps (as shown in FIG. 2, reference numeral 18). Layer 14 is formed from one or more layers of titanium nitride, titanium silicate nitride, titanium silicate, titanium aluminum nitride, tantalum silicate, or tantalum silicate nitride. Preferably, the layer 14 includes a thin layer 14a (0–50 nm) of tantalum silicate (TaSi) over which a thicker layer 14b (5–200 nm) of tantalum silicate nitride (TaSiN) is deposited.

An iridium containing layer 16 is then deposited. Preferably, layer 16 includes a layer 16a of iridium at a thickness from 5 nm to 200 nm on which a layer 16b of iridium oxide is deposited preferably at a thickness from 5 $\mu$m to 200 nm.

An electrode layer 18 is then formed over layer 16. A conductive noble metal is deposited for forming the electrode layer at a thickness from about 10 nm to about 700 nm. The noble metal may be initially disposed as one or more layers of pure noble metals Pt, Ir, Ru, Re, Rh, Pd, Os, Au, Ag, alloys of these noble metals with noble or non-noble metals, and oxides of these noble metals or noble metal alloys. Preferably, the noble metal is platinum (Pt).

An adhesive film 20 is formed on the conductive film 18. The adhesive film increases the adhesion between the conductive film 18 and a mask film formed in subsequent process steps. The adhesive film is preferably a silicon nitride film (SiN) at a thickness of 5–50 nm. A mask layer of suitable material is formed on top of the wafer surface. Suitable mask layers and their layer structures are disclosed in U.S. Ser. No. 09/501,479 entitled, "Easy to Remove Hard Mask Layer for Semiconductor Device Fabrication", filed on Feb. 9, 2000 to Athavale et al., and incorporated herein by reference. The mask layer is opened using a conventional plasma etching process followed by an optional photoresist removal step. For example, the masking layer includes layer 22 formed onto the adhesive film 20. Layer 22 is preferably a low k dielectric polymer such as for example those low k dielectric materials commercially available by Dow Chemical Company under the trade name SiLK. An oxide layer may be formed on the dielectric surface and patterned by a photolithography process to form mask patterns 30. The mask layer is at a thickness of 500 nm to 1200 nm.

Deposition of the materials forming the individual layers of the barrier and electrode film stack may employ conventional deposition processes such as for example, a chemical vapor deposition (CVD) process, assisted CVD, physical vapor deposition (PVD), ion-assisted plating, liquid delivery, sputtering, ablation, or any other suitable technique known in the art for deposition of metal onto a substrate.

Figure 4:
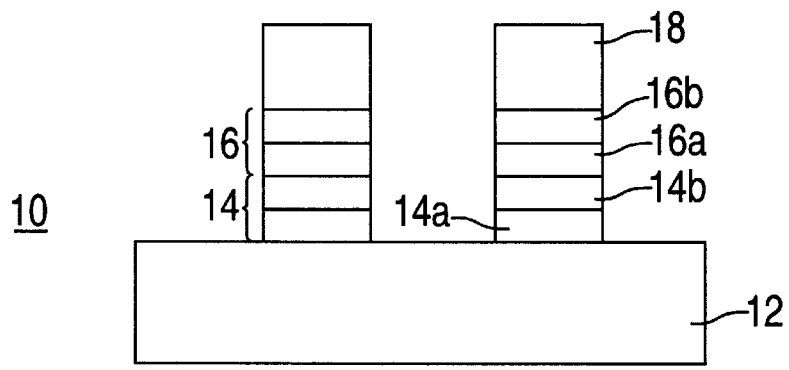

The wafer 10 is then placed in a plasma etch chamber and exposed to a reactive plasma. A plasma gas mixture is excited to generate the plasma. The plasma gas mixture included $Ar_2$, $Cl_2$, $BCl_3$, and $CF_4$. Conductive layer 18 and barrier film layers 14, 16 are simultaneously etched by the plasma to the substrate surface 12. The resulting structure, after conventional hard mask removal, is shown in FIG. 4. Advantageously, the simultaneous etching of the conductive layer and the barrier layers eliminates the need for the multiple and complex processing steps noted in the prior art. A single photolithographic patterning step is required. Morever, in addition to improved throughput, practicing the plasma process results in an expanded process window with improved profile angles, i.e., greater than 75 degrees.

The multilayer film stack formed on the substrate preferably includes layers in the following order: Pt/$IrO_2$/IR/TaSiN/TaSi (layers 18, 16b, 16a, 14b, and 14a, as shown in FIG. 2). As the platinum electrode layer 18 is etched, an endpoint is conventionally detected, e.g., optically monitoring the emission signal at 337 nm, thereby exposing the underlying $IrO_2$ surface. At this point, in order to increase the etching selectivity and throughput, it is preferred to increase the concentrations of the carbon bearing gas and fluorine bearing gas in the plasma gas mixture, e.g., increase the flow rate and concentration of $CF_4$ in the plasma gas mixture. It has been found that by increasing the concentration of reactive fluorine and carbon species, the etching rate of the $IrO_2$ film is significantly increased. For example, it has been found that the etch rate of the $IrO_2$ film with a plasma including species of argon, chlorine, carbon and fluorine was 120 nm/min compared to an etch rate of 5 nm/min under similar conditions without reactive the fluorine and carbon species. After the multilayer film stack has been etched to the surface of the substrate, overetching the film stack may be used to increase the vertical angle of the profiles.

Figure 5:
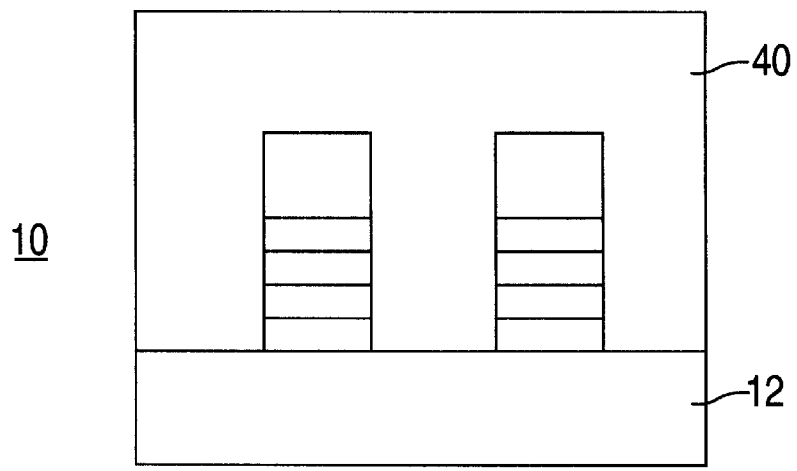
Figure 6:
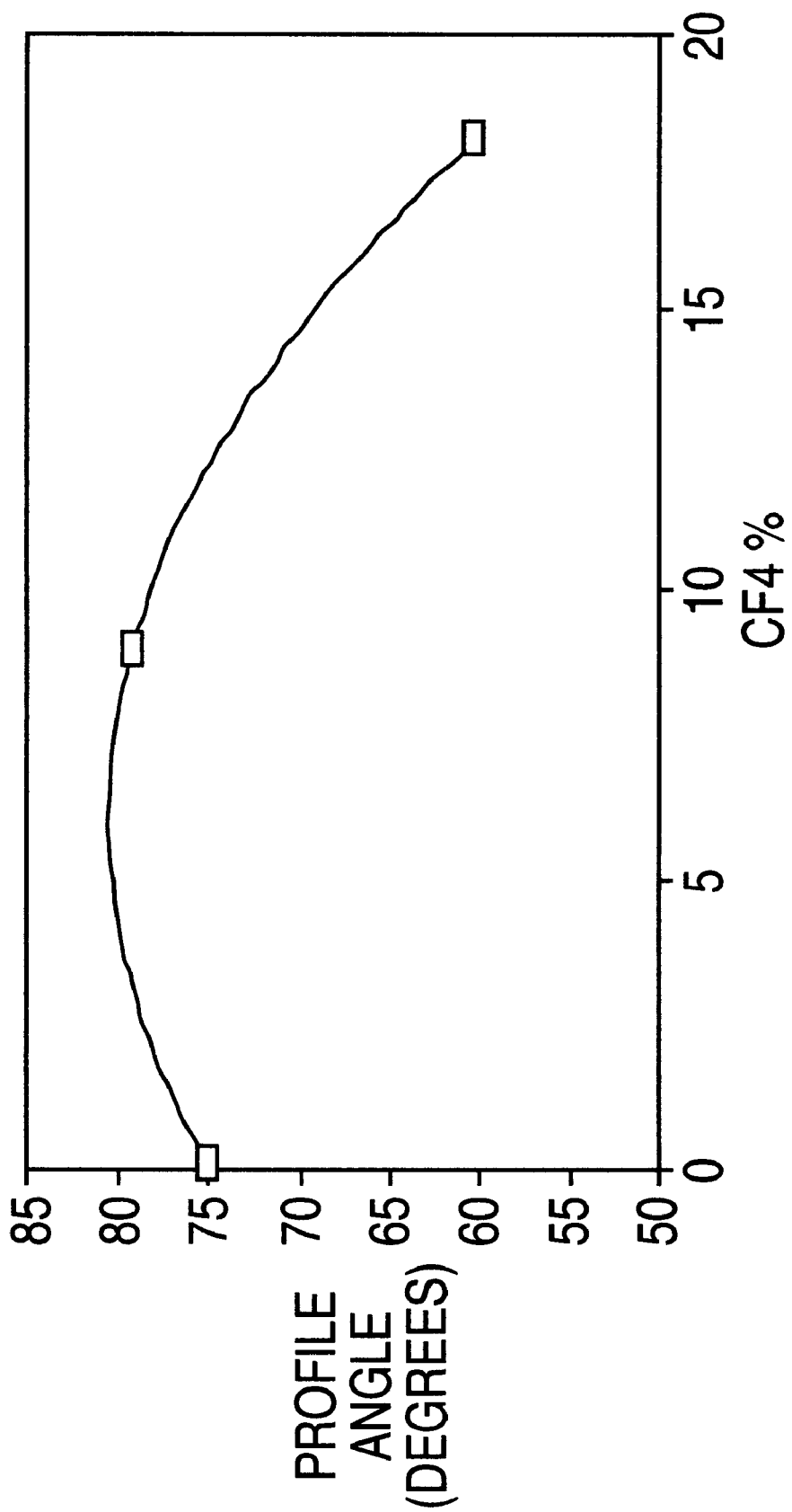
FIG. 6 is a graph showing the variation in profile angle as a function of the percent of $CF_4$ in the plasma.

In addition to the aforementioned process of forming the multilayer film stack including the barrier and electrode layers, additional steps are added to finish the formation of capacitor cells. As shown in FIG. 5, a dielectric layer 40 with a preferred thickness between about 5 to 20 nm is formed over the first electrodes 18, typically with dielectric materials having a high dielectric constant. Preferably, the dielectric material has a dielectric constant greater than 200, for example, dielectric materials such as barium strontium titanate (BST), lead zirconate titanate (PZT), lanthanum-doped PZT (PLZT) and the like. The use of high dielectric material improves the capacitive effect and functional characteristics of the capacitor cells.

Advantageously, the process provides a simplified process step for patterning a multi-layer film stack including the noble metal lower electrode and multilayer barrier structure. The process efficiently patterns the film stack and can be further optimized by adjusting the ratios of the argon, chlorine, fluorine and carbon species generated in the plasma for each particular film material. Use of the process results in a high etch rate and selectivity, improved profile anisotropy and improved microloading and as such, overcomes the problems noted in the prior art. Moreover, the use of the process significantly reduces costs due to simplicity and ease of integration.

The following examples fall within the scope of, and serve to exemplify, the more generally described methods set forth above. The examples are presented for illustrative purposes only, and are not intended to limit the scope of the invention.

EXAMPLES

Example 1

In this example, a multilayer film stack including a noble metal electrode and a multilayer barrier film stack were simultaneously etched in a single process step. The film stack included, in order, a platinum electrode layer, an $IrO_2$ layer, an Ir layer, a TaSiN layer, a TaSi layer, and the silicon substrate. A hard mask was formed on the multilayer film stack. The initial structure prior to etching is shown in FIG. 3, a scanning electron microphotograph of a cross section of the film stack and hard mask. The substrate was then placed into a reaction chamber of an Applied Materials Hot DPS Plasma Etcher. The chuck temperature was at 330° C., He BSP at 1 torr. The plasma conditions and plasma gas process flows are shown in table I. The process conditions are set forth in Table I.

TABLE I

| FILM STACK LAYER | Chamber Pressure (mTorr) | Cl$_2$ (sccm) | Ar$_2$ (sccm) | BCl$_3$ (sccm) | CF$_4$ (sccm) | Power (watts) | Bias (watts) |
|---|---|---|---|---|---|---|---|
| Pt | 36 | 160 | 40 | 13 | 22 | 1200 | 450 |
| IrO$_2$/Ir | 36 | 160 | 40 | 13 | 22 | 1200 | 450 |
| TaSiN | 36 | 160 | 40 | 13 | 22 | 1200 | 450 |

After processing, the substrates were removed from the reaction chamber, the mask removed and the substrates cross sectioned. A scanning electron microphotograph of a representative cross section is shown in FIG. 4. Analysis of the cross section showed that the entire film stack was etched to the substrate surface. Moreover, the microphotograph clearly shows a profile angle greater than about 75 degrees indicating improved selectivity to the mask layer. Etch rate microloading effects between the dense array and field areas (isolated areas) has been demonstrated to be less than 5%.

Example 2

In this example, the concentration of CF$_4$ was varied during etching for the particular layers in the film stack. The substrates were prepared as in Example 1. The plasma conditions and plasma gas process flows are shown in Table II. Optical endpoint detection was utilized to indicate removal of the previous layer.

TABLE II

| FILM STACK LAYER | Chamber Pressure (mTorr) | Cl$_2$ (sccm) | Ar$_2$ (sccm) | BCl$_3$ (sccm) | CF$_4$ (sccm) | Power (watts) | Bias (watts) |
|---|---|---|---|---|---|---|---|
| Pt | 36 | 160 | 40 | 13 | 5 | 1200 | 450 |
| IrO$_2$/Ir | 36 | 160 | 40 | 13 | 22 | 1200 | 450 |
| TaSiN | 36 | 160 | 40 | 13 | 0 | 1200 | 200 |

The results showed greater control of the profiles. Moreover, increasing the carbon and fluorine concentration during etching of the iridium containing layers, resulted in a significant increase in etch rate. The etch rate was determined to be 120 nm/min for this layer.

Example 3

In this example, the profile wall angle was measured as a function of the percentage of CF$_4$ in the plasma gas mixture. Substrates were prepared and exposed in accordance with example 1. The percentage of CF$_4$ in the gas mixture was varied from 0, 9 and 18%. The etching process was terminated immediaetly after an endpoint was reached minimizing overetching. The results are shown in the graph of FIG. 5.

At 0 percent, the etching process did not remove the barrier layers, even during over etching conditions. As shown in the graph, introducing CF$_4$ into the plasma at a concentration up to about 11 to 12 percent resulted in profile angles greater than 75 degrees. The profiles within this range exhibited high mask selectivity. Increasing the CF$_4$ concentration to amounts greater than 16 to percent resulted in sloped profiles, i.e., profile angles less than 70 degrees. Moreover, it is clear from the analysis of these wafers that the mask selectivity was poor.

While preferred embodiments have been shown and described, various modifications and substitutions may be made thereto without departing from the spirit and scope of the invention. Accordingly, it is understood that the present invention has been described by way of illustrations and not limitation.

We claim:

1. A method of forming a lower electrode of a capacitor, the method comprising:
   forming a barrier film on a semiconductor substrate, the barrier film comprising one or more layers of a compound selected from the group consisting of titanium nitride, titanium silicate, titanium silicate nitride, titanium aluminum nitride, tantalum silicate and tantalum silicate nitride, iridium, iridium oxide and mixtures thereof;
   forming a conductive film containing a metal on the barrier film, the conductive film comprising one or more layers of a noble metal selected from the group consisting of platinum, palladium, gold, silver, ruthenium, osmium, rhenium, rhodium, iridium, oxides of these noble metals and alloys thereof;
   forming a patterned mask layer on the conductive film, wherein the mask layer selectively exposes portions of the conducting film; and
   etching with a plasma the exposed portions of the conductive film to a surface of the semiconductor substrate, wherein the plasma removes the exposed portions of the conductive film and respective portions of the underlying barrier film, the plasma being formed from an excitable gas mixture essentially free from a hydrogen bearing gas, the excitable gas mixture comprising argon gas, a chlorine bearing gas, a carbon bearing gas and a fluorine bearing gas.

2. The method of claim 1, wherein the chlorine bearing gas is selected from the group consisting of Cl$_2$, BCl$_3$, CCl$_4$, SiCl$_4$.

3. The method of claim 1, wherein the plasma gas mixture consists essentially of Ar, Cl$_2$, BCl$_3$ and CF$_4$.

4. The method of claim 1, wherien the plasma gas mixture consists essentially of Ar, N$_2$, Cl$_2$, BCl$_3$ and CF$_4$.

5. The method of claim 1, wherein the fluorine bearing gas is selected from the group consisting of $F_2$, $CF_4$, $C_2F_8$, $C_4F_8$, $SF_6$ and mixtures thereof.

6. The method of claim 1, wherein the carbon bearing gas is selected from the group consisting of $CCl_4$, $CF_4$, $C_2F_6$, $C_2F_8$ and mixtures thereof.

7. The method of claim 1, wherein a concentration of fluorine is in an amount ranging from 1 to 50 percent of the gas mixture.

8. The method of claim 1, wherein a concentration of fluorine is in an amount ranging from 7 to 20 percent of the gas mixture.

9. The method of claim 1, wherein a concentration of carbon is in an amount ranging from 1 to 20 percent of the gas mixture.

10. The method of claim 1, wherein a concentration of carbon is in an amount ranging from 2 to 10 percent of the gas mixture.

11. The method of claim 1 further comprising heating the substrate during etching to a temperature greater than about 200° C.

12. The method of claim 1 further comprising heating the substrate during etching to a temperature in a range from about 300° C. to about 350° C.

13. A process for removing exposed portions of a multilayer film stack from a substrate, the
multilayer film stack comprising a noble metal layer and one or more barrier layers, the process comprising:
reacting the exposed portions of the multilayer film stack with reactive species for a period of time effective to substantially remove the film stack from the substrate, the reactive species being essentially free from hydrogen species are generated by exposing an excitable gas mixture to an energy source sufficient to generate the reactive species, the gas mixture comprising argon, a chlorine bearing compound, a carbon bearing compound and a fluorine bearing compound.

14. The process of claim 13 further comprising heating the substrate to a temperature greater than about 200° C.

15. The process of claim 13 further comprising heating the substrate to a temperature in a range from about 300° C. to about 350° C.

16. The process of claim 13, wherein the amount of carbon bearing compound and fluorine bearing compound is increased during exposure of the barrier layer.

17. The process of claim 13, wherein a concentration of fluorine in the gas mixture is from 1 percent to 50 percent.

18. The process of claim 13, wherein a concentration of fluorine in the gas mixture is from 7 percent to 20 percent.

19. The process of claim 13, wherein a concentration of carbon in the gas mixture is from 1 percent to 20 percent.

20. The process of claim 13, wherein a concentration of carbon in the gas mixture is from 2 percent to 10 percent.

21. The process of claim 13, wherein the multilayer film stack comprises a platinum layer, an iridium containing layer and a tantalum containing layer.

22. The process of claim 21, wherein the iridium containing layer comprises a layer of iridium oxide and a layer of iridium.

23. The process of claim 21, wherein the tantalum containing layer comprises a layer of tantalum silicate and a layer of tantalum silicate nitride.

* * * * *